(12) United States Patent
Kasai

(10) Patent No.: US 6,977,359 B2
(45) Date of Patent: Dec. 20, 2005

(54) METHOD AND DEVICE FOR VACUUM TREATMENT

(75) Inventor: Shigeru Kasai, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/477,593

(22) PCT Filed: May 17, 2002

(86) PCT No.: PCT/JP02/04809

§ 371 (c)(1),
(2), (4) Date: Nov. 14, 2003

(87) PCT Pub. No.: WO02/095087

PCT Pub. Date: Nov. 28, 2002

(65) Prior Publication Data

US 2004/0144770 A1   Jul. 29, 2004

(30) Foreign Application Priority Data

May 18, 2001   (JP)   ............................. 2001-150102

(51) Int. Cl.$^7$ ................................................ H05B 1/02
(52) U.S. Cl. ................. 219/490; 219/497; 219/121.43; 219/121.59; 156/345.24
(58) Field of Search ....................... 219/121.43, 121.4, 219/121.41; 204/298.21, 298.37, 298.38; 156/345.34, 345.31, 345.24; 118/723 R, 118/723 I, 723 MW

(56) References Cited

U.S. PATENT DOCUMENTS 4,013,539 A * 3/1977 Kuehnle ................ 204/298.24
5,871,805 A * 2/1999 Lemelson ....................... 427/8
6,151,532 A * 11/2000 Barone et al. ............... 700/121
6,165,312 A * 12/2000 Smith et al. ........... 156/345.24
6,197,116 B1 * 3/2001 Kosugi ....................... 118/712
6,207,936 B1   3/2001 de Waard et al.
2003/0052083 A1 * 3/2003 Kim et al. ..................... 216/59
2003/0079983 A1 * 5/2003 Long et al. .................. 204/164

FOREIGN PATENT DOCUMENTS

| JP | 7-283163 | 10/1995 |
| JP | 8-165585 | 6/1996 |
| JP | 2693880 | 9/1997 |
| JP | 2000-509171 | 7/2000 |

* cited by examiner

Primary Examiner—Mark Paschall
(74) Attorney, Agent, or Firm—Smith, Gambrell & Russell, LLP

(57) ABSTRACT

A vacuum-processing method carries out, in a vacuum-processing vessel (4), a process wherein a condition of an interior of the vacuum processing vessel (4) changes as the number of processed objects (W) increases, such as a film-forming process for forming a thin film on a semiconductor wafer (W) by using a process gas in the vacuum processing vessel (4). The vacuum-processing method controls a controlled parameter directly affecting an effect of the process, such as film thickness, so that the controlled parameter is maintained at a target value ($r_t$). The vacuum-processing method determines a model function obeying a change of the condition of the interior of the processing vessel (4), and calculates the target value ($r_t$) of the controlled parameter every time one or a plurality of objects (W) are processed on the basis of a set value ($D_t$) of a set parameter representing the effect of the process, and the model function.

10 Claims, 2 Drawing Sheets

METHOD AND DEVICE FOR VACUUM TREATMENT

TECHNICAL FIELD

The present invention relates to a vacuum-processing method of processing an object, such as a semiconductor wafer, in a processing vessel by a process, such as a film-forming process, and a vacuum-processing apparatus for carrying out the same.

BACKGROUND ART

Generally, a semiconductor wafer, such as a silicon substrate, is subjected to various vacuum processes including a film-forming process and an etching process to fabricate a semiconductor integrated circuit. It is very important, from the viewpoint of improving the yield of the product and stabilizing the electrical characteristic the product, particularly for a single-substrate vacuum-processing apparatus that processes a single semiconductor wafer at a time to be capable of forming thin films of the same thickness on successively subjected to the film-forming process one by one, i.e. of maintaining thickness reproducibility.

In processing a semiconductor wafer by such a conventional vacuum-processing apparatus, the semiconductor wafer is mounted, for example, on a susceptor placed in a processing vessel, and heated by a heater to keep the semiconductor wafer at a predetermined temperature. At the same time, a process gas, such as a deposition gas, is supplied at a predetermined gas supply rate into the processing vessel while the processing vessel is being evacuated to maintain a predetermined pressure in the processing vessel. In this state, the film-forming process is continued for a predetermined processing time to process the semiconductor wafer. Process parameters including the processing temperature and the processing pressure in the processing vessel, and the gas supply rates of the process gases are stably maintained by a feedback control operation during the film-processing operation.

Unnecessary substances deposit gradually in unnecessary films on the inner surface of the walls of the processing vessel, the surface of a showerhead through which process gases are supplied, and the surface of the susceptor as the number of processed wafer increases with the continuation of the film-forming process. Consequently, the gradual change of the condition of the processing vessel, such as a reflectivity and a view factor in the processing vessel, is unavoidable. Therefore, although the process parameters are controlled so that the same process conditions, such as the same processing temperature, the same flow rates of the process gases and the same processing pressure, may be maintained, the thickness of the thin film formed on wafers changes (for example, decreases) every time one wafer is processed, so that the thickness reproducibility of the film-forming process deteriorates.

The interior of the processing vessel is cleaned periodically or indeterminately to remove the unnecessary films. Such a mode of change of the thickness of the thin film formed on the wafer varies periodically every time the interior of the processing vessel is cleaned or every time a batch of wafers (for example, twenty-five wafers) is processed. Such a problem may be solved by cleaning the interior of the processing vessel every time one or some wafers are processed. However, excessively frequent cleaning of the interior of the processing vessel decreases the throughput greatly and hence is unpractical.

Enhancement of severity of design rules of the semiconductor integrated circuits and demand for finer lines and thinner films in recent years require the solution of such a problem urgently.

DISCLOSURE OF THE INVENTION

The present invention has been made in view of the foregoing problem. According to a first aspect of the present invention, a vacuum-processing method of carrying out, in a vacuum processing vessel, a process wherein a condition of an interior of the processing vessel changes as the number of processed objects increases, and controlling a controlled parameter affecting an effect of the process directly so that the controlled parameter is maintained at a target value, the vacuum-processing method comprises the steps of: determining a model function obeying a change of the condition of the interior of the processing vessel; and calculating the target value of the controlled parameter every time one or a plurality of objects are processed, on the basis of the model function and a set value of a set parameter representing the effect of the process.

In the vacuum-processing method, it is preferable that the model function is updated on the basis of measured data of the effect of the process, such as a measured thickness of the film formed by processing the object. It may be decided that the measured data and/or data obtained by using the model function is abnormal when the difference between the measured data and the data obtained by using the model function is not smaller than a reference value.

The model function can be produced by any one of a least-squares method, a Kalman filter and a maximum likelihood estimation method.

In one embodiment of the vacuum-processing method, the process is a film-forming process for forming a thin film on the object by supplying a deposition gas into the processing vessel, the set parameter is either the thickness of the film or the sheet resistivity of the film, and the controlled parameter is any one of a processing temperature in the processing vessel, a processing time for processing each object and a gas supply rate of the deposition gas.

According to a second aspect of the present invention, a vacuum-processing apparatus comprising a vacuum processing vessel for containing an object to carry out a process wherein a condition of an interior of the processing vessel changes as the number of processed objects increases in the processing vessel, the vacuum-processing apparatus further comprises: a controller for controlling a controlled parameter affecting an effect of the process directly so that the controlled parameter is maintained at a target value; and a processing condition compensator storing a model function obeying a change of the condition of the interior of the processing vessel, and calculating the target value of the controlled parameter on the basis of the model function and a set value of a set parameter representing the effect of the process.

In the vacuum-processing apparatus, it is preferable that the processing condition compensator updates the model function on the basis of measured data of the effect of the process.

BEST MODE FOR CARRYING OUT THE INVENTION

A vacuum-processing method and a vacuum-processing apparatus in a preferred embodiment according to the present invention will be described with reference to the accompanying drawings as applied to a single-wafer film-forming apparatus for carrying out a film-forming process for forming a thin film on a semiconductor wafer. In the following description of the single-wafer film-forming apparatus, a control of processing temperature among processing conditions, i.e. controlled parameters, will be described by way of example.

Figure 1:
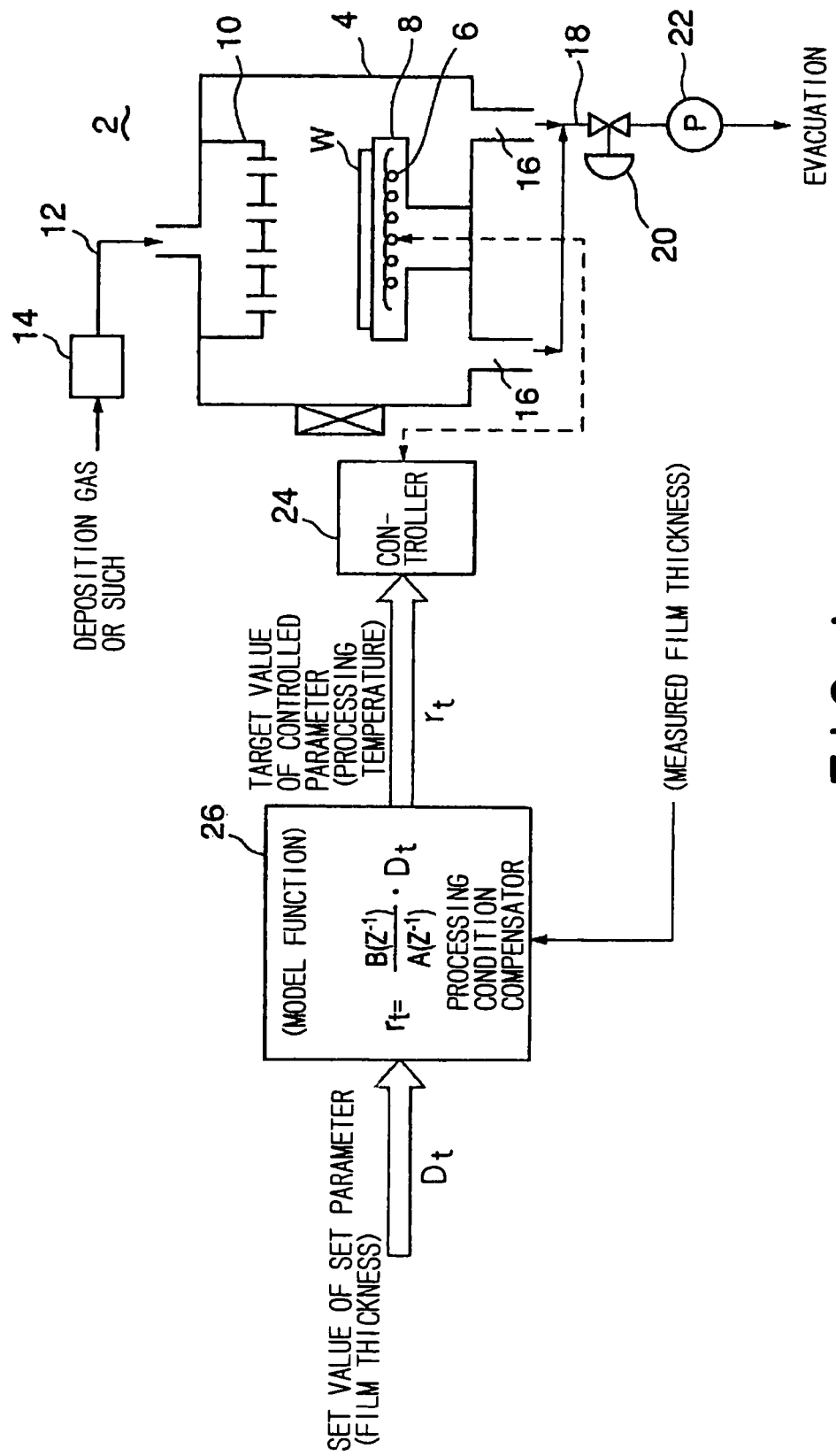
FIG. 1 is a typical view of a vacuum-processing apparatus in a preferred embodiment according to the present invention for carrying out a vacuum-processing method.

Referring to FIG. 1, a vacuum-processing apparatus 2 in a preferred embodiment according to the present invention has a cylindrical processing vessel 4 formed of, for example, aluminum. A susceptor 8 for supporting a semiconductor wafer W, i.e. an object, thereon is set in the processing vessel 4. The susceptor 8 is provided with a built-in resistance heater 6 for heating the wafer W mounted on the susceptor 8. Heating lamps may be used instead of the resistance heater 6.

A showerhead 10 as a gas supply means, is attached to the top wall of the processing vessel 4. A process gas, such as a deposition gas, is supplied through a gas supply line 12 into the showerhead 10. The flow of the process gas is controlled by a flow controller 14, such as a mass-flow controller, placed in the gas supply line 12. Practically, the vacuum processing apparatus 2 is provided with a plurality of gas supply lines and a plurality of flow controllers corresponding to the number of necessary types of gases.

The processing vessel 4 is provided with an exhaust port 16 in its lower part. An exhaust line 18 is connected to the exhaust port 16. The exhaust line is provided with an automatic pressure-control valve 20 and a vacuum pump 22 to evacuate the processing vessel 4.

The flow controller 14, the heater 6 and the automatic pressure-control valve 20 are connected to a controller 24 including, for example, a microcomputer. The controller 24 performs a feedback control operation to maintain processing conditions including a processing temperature, a processing pressure and gas flow rates at predetermined target values. As mentioned above, the vacuum-processing method in this embodiment will specifically be described as applied to controlling the processing temperature.

The controller 24 is connected to a processing condition compensator 26 including, for example, a microcomputer. The processing condition compensator 26 calculates target values of controlled parameters on the basis of set values of set parameters given thereto, and gives the calculated target values to the controller 24.

The controlled parameters are those that affect the effect (result) of the process directly, namely, processing conditions including the gas flow rates, the processing temperature, the processing pressure, a processing time for each wafer, and such. In the description of this embodiment, the control of the processing temperature as the controlled parameter will be explained by way of example. The set parameters are those defining the effect of the process, such as a thickness, a sheet resistivity (of a metal film), a reflectivity of a thin film formed on the wafer by the film-forming process, and a stress induced in the thin film.

The following description will deal with a case where the set parameter is the thickness of the thin film formed on the wafer.

A host computer, not shown, or the like gives the target values of the processing conditions other than the processing temperature, such as the processing pressure, the gas flow rates, and the processing time to the controller 24, and gives a set film thickness $D_t$, i.e. a target value of the set parameter, is given to the processing condition compensator 26 on the basis of a predetermined recipe for the film-forming process. The target values of the processing conditions other than the processing temperature, such as the processing pressure, the gas flow rates, and the processing time are set values. The processing condition compensator 26 determines a target value $r_t$ of the processing temperature, i.e. a controlled parameter, and gives the same to the controller 24.

A model function obeying a change of the condition of an interior of the processing vessel 4 that changes with the number of processed wafers is stored beforehand in the processing condition compensator 26. The processing condition compensator 26 calculates the target value $r_t$ of the processing temperature as the controlled parameter, on the basis of the set film thickness $D_t$ as the set parameter.

As mentioned above, the thickness of a film formed on a wafer by the film-forming process is a variable having periodicity varying every time the interior of the processing vessel 4 is cleaned or every time a batch of wafers (for example, twenty-five wafers) is processed. The mode of variation of the film thickness is determined beforehand through measurement. A mode of the processing temperature change to keep the film thickness constant is determined, and the model function is defined by using the mode of the processing temperature change. The model function thus defined is stored in the processing condition compensator 26.

The model function employed by this embodiment is an autoregressive moving-average model (ARMA model) represented by Expression (1).

$$r_t = \{B(Z^{-1})/A(Z^{-1})\} \cdot D_t \quad (1)$$

where:

$r_t$: Target value of the controlled parameter (processing temperature)

$D_t$: Set value of the set parameter (film thickness)

$A(Z^{-1}) := 1 + a_1 \cdot Z^{-1} + a_2 \cdot Z^{-2} + \ldots + a_n \cdot Z^{-n}$ $B(Z^{-1}) := b_1 \cdot Z^{-1} + b_2 \cdot Z^{-2} + \ldots + b_n \cdot Z^{-n}$ The coefficients $a_1$ to $a_n$ are represented by $a_i$, the coefficients $b_1$ to $b_n$ are represented by $b_i$, and $Z^{-1}$ to $Z^{-n}$ are represented by $Z^{-i}$, where i=1 to n. $Z^{-i}$ are time-delay operators. $Z^{-i}$ indicates data obtained in a processing cycle preceding the present processing cycle by "i" processing cycles, i.e. a set film thickness for each delay time and a target processing temperature determined at that time. When it is desired to form a film of the same thickness in each of processing cycles of the film-forming process, set values of film thickness for $Z^{-i}$ are the same.

The coefficients $a_i$ and $b_i$ can be determined by, for example, the recursive least-squares method using varying measured film thickness having periodicity (the mode of variation of the film thickness in the foregoing description).

In the foregoing expressions, "n" indicates the dimension of the model function. Usually, the model function may be a cubic or quartic model function. If n=3, data (the set film thickness and the target processing temperature) on processing one to three preceding wafers is used. If n=4, data on processing one to four preceding wafers is used. If n=3, Expression (1) is written as follows.

$$r_t = \{(b_1 \cdot Z^{-1} + b_2 \cdot Z^{-2} + b_3 \cdot Z^{-3})/(1 + a_1 \cdot Z^{-1} + a_2 \cdot Z^{-2} + a_3 \cdot Z^{-3})\} \cdot D_t$$

Thus, a transfer function representing the relationship between film thickness and the processing temperature for the number of wafers, namely, a model function, can be obtained by using Expression (1).

Although Expression (1) may be obtained by using a model other than the autoregressive moving-average model; Expression (1) may be obtained by using an autoregressive model (AR model). When an autoregressive model is used, the coefficients $a_1$ to an are zero, and hence a model function represented by Expression (2) is obtained.

$$r_t = B(Z^{-1}) \cdot D_t \qquad (2)$$

Figure 2:
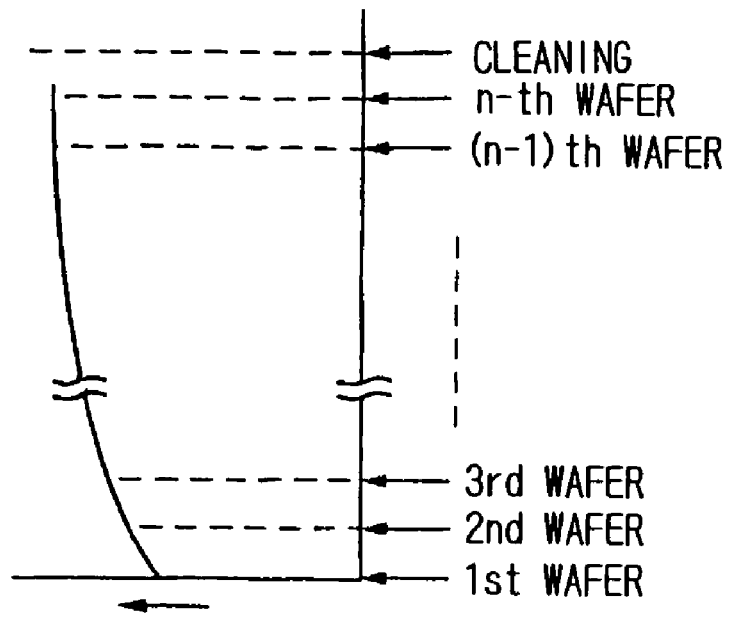
FIG. 2 is a conceptional view of assistance in explaining the operation of a processing condition compensator shown in FIG. 1.
Figure 2:
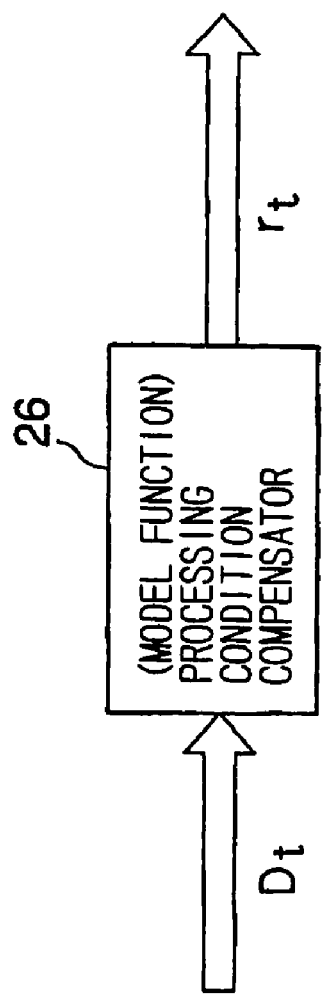

The target processing temperature $r_t$ is changed according to the number of processed wafers for the same set film thickness $D_t$ as shown in FIG. 2 when the described model function is used.

The model function raises the target processing temperature gradually according to the number of processed wafers as shown in FIG. 2 to form films of the same film thickness on the successively processed wafers. It is possible that the target processing temperature is decreased according to the number of processed wafers in forming some other type of film on wafers. The value of "n" is reset to "1" and the first processing cycle for processing the first wafer is started when the interior of the processing vessel is cleaned. Practically, the model function is not a continuous function as shown in FIG. 2, but the same is a discrete function.

As apparent from the foregoing description, the processing condition compensator 26 determines an optimum target processing temperature for each processing cycle for processing a wafer, and the controller 24 controls the processing temperature at the target processing temperature by the feedback control operation. Consequently, reproducibility of the film thickness as the effect of the process can significantly be improved, when successively processing a plurality of wafers one by one.

Although the coefficients $a_1$ to $a_n$ and $b_1$ to $b_n$ of the model function used by this embodiment are fixed, coefficients $a_1$ to $a_n$ and $b_1$ to $b_n$ may be corrected every time one wafer is processed to update the model function. When the coefficients $a_1$ to $a_n$ and $b_1$ to $b_n$ are thus changed, the thickness of a film formed on a wafer by the preceding processing cycle is measured by a thickness-meter or the like, and a measured thickness is given to the processing condition compensator 26. Then, the processing condition compensator 26 determines new coefficients $a_i$ and $b_i$ by, for example, the recursive least-squares method, using the measured thickness (FIG. 1).

The coefficients $a_i$ and $b_i$ of the model function are determined by the recursive least-squares method as follows.

An estimate $*\theta_N$ of the N-th coefficient is calculated by using Expression (3).

$$*\theta_N = *\theta_{N-1} + P_N \cdot Z_N (Y_N - Z_N^T \cdot \theta_{N-1}) \qquad (3)$$

where $P_N$ is defined by Expression (4).

$$P_N = P_{N-1} - (P_{N-1} \cdot Z_N \cdot Z_N^T \cdot P_{N-1})/(1 + Z_N^T \cdot P_{N-1} \cdot Z_N) \qquad (4)$$

where a symbol "*" signifies an estimate, a character "T" signifies a transposed matrix, and characters $\theta$, P, Z and y represents matrices, and

*$\theta$: N-th estimate $[a_1, a_2, \ldots, a_n, b_1, b_2, \ldots, b_n]$ $y_N$: N-th output (i.e. measured film thickness)

$P_N$: N-th covariance matrix indicating the degree of change of the next estimate $Z_N$: $[-y_{N-(n-i)}, \ldots, y_{N-1}, U_{N-(n-1)}, \ldots, U_{n-1}]$ where $U_N$ is a matrix representing the N-th manipulated amount (i.e. target processing temperature).

This operation is performed to change the coefficients $a_i$ and $b_i$ of the model function on the basis of the measured film thickness every time one wafer is processed. Thus, the model function can be updated so as to conform to the measured film thickness and thereby the thickness reproducibility can further be improved.

When the difference between the data calculated by using the model function, and the measured film thickness is not smaller than a predetermined value, it is proper to decide that the calculated data and/or the measured film thickness is inappropriate and abnormal.

The difference is tested to see whether or not the calculated data and/or the measured thickness is abnormal by using Expression (5) using the same symbols as those used by Expression (3).

$$\|Y_N - Z_N^T \cdot *\theta_{N-1}\| \geq C \qquad (5)$$

where value between vertical lines ($\|\ \|$) is absolute value, and C is an optional constant for deciding whether or not the difference is abnormal.

The operator can quickly determine whether or not the film-forming process is abnormal by examining the difference on the basis of the measured film thickness.

Although this embodiment uses the recursive least-squares method to determine the coefficients $a_i$ and $b_i$ of the model function or to update the model function, a Kalman filter or a maximum likelihood estimation method may be used instead of the recursive least-squares method.

Although the embodiment has been described on an assumption that the controlled parameter is processing temperature, the controlled parameter may be any parameter that directly affects the film thickness as the effect of the process. For example, the controlled parameter may be any one of the processing conditions including the processing time (film-forming time), the processing pressure and deposition gas supply rate. It goes without saying that processing temperature is kept constant if the processing condition other than processing temperature is used as a controlled parameter.

Although the embodiment uses the thickness of the film formed on the wafer as the set parameter, the set parameter may be any parameter provided that the parameter is in fixed relation with film thickness. For example, when a metal film is formed on a wafer, the sheet resistivity of the film may be used as the set parameter.

Although the processing condition compensator 26 in the embodiment calculates a target value of the controlled parameter every time one wafer is processed, the processing condition compensator 26 may calculate a target value of the controlled parameter every time two or more wafers are processed if the condition of the interior of the processing vessel changes comparatively slowly with the increase of the number of processed wafers.

The present invention is suitably applicable to a film forming process, such as a CVD film-forming process and is particularly effective in forming $WSi_x$ films, Ti films (titanium films), TiN films and the like. However, the present invention is not limited in its practical application to film-forming processes for forming those films, and is applicable to various vacuum processes to be carried out in vacuum processing vessels including etching processes, annealing processes, ashing processes and such. The object is not limited to a semiconductor wafer. The present invention is applicable to processing other objects including LCD substrates, glass substrates and such.

What is claimed is:

1. A vacuum-processing method of carrying out, in a vacuum processing vessel, a process wherein an effect of the process changes as the number of processed objects increases, and controlling a controlled parameter affecting the effect of the process directly so that the controlled parameter is maintained at a target value, said vacuum-processing method comprising the steps of:

determining a mode of variation of the effect of the process through measurement;

determining a mode of the controlled parameter change to keep the effect of the process constant;

determining a model function on the basis of the determined mode of variation of the effect of the process and the determined mode of the controlled parameter change; and calculating the target value of the controlled parameter every time one or a plurality of objects are processed, on the basis of the model function and a set value of a set parameter representing the effect of the process.

2. The vacuum-processing method according to claim 1, wherein the model function is updated on the basis of measured data of the effect of the process.

3. The vacuum-processing method according to claim 2, wherein it is decided that the measured data and/or data obtained by using the model function is abnormal when the difference between the measured data and the data obtained by using the model function is not smaller than a reference value.

4. The vacuum-processing method according to claim 1, wherein the model function is produced by any one of a least-squares method, a Kalman filter and a maximum likelihood estimation method.

5. The vacuum-processing method according to claim 1, wherein the process is a film-forming process for forming a thin film on the object by supplying a deposition gas into the processing vessel, the set parameter is either the thickness of the film or the sheet resistivity of the film, and the controlled parameter is any one of a processing temperature in the processing vessel, a processing time for processing each object and a gas supply rate of the deposition gas.

6. The vacuum-processing method according to claim 5, wherein the model function is updated on the basis of the measured film thickness as the measured data of the effect of the process.

7. The vacuum-processing method according to claim 1, wherein the model function is an autoregressive moving-average model represented by Expression (1):

$$r_t = \{B(Z^{-1})/A(Z^{-1})\} \cdot D_t \tag{1}$$

where:

$r_t$ represents the target value of the controlled parameter,
$D_t$ represents the set value of the set parameter,
$A(Z^{-1})$ is equal to $1+a_1+Z^{-1}+a_2 Z^{-2}+ \ldots +a_n Z^{-n}$,
$B(Z^{-1})$ is equal to $b_1 Z^{-1}+b_2 Z^{-2}+ \ldots +b_n Z^{-n}$,
wherein the coefficients $a_1$ to $a_n$ are represented by $a_i$, the coefficients $b_1$ to $b_n$ are represented by $b^i$, and $Z^{-1}$ to $Z^{-n}$ are represented by $Z^{-i}$, where i=1 to n, $Z^{-i}$ are time-delay operators, $Z^{-i}$ indicates data obtained in a processing cycle preceding the present processing cycle by "i" processing cycles.

8. A vacuum-processing apparatus comprising a vacuum processing vessel for containing an object to carry out a process wherein an effect of the process changes as the number of processed objects increases in the processing vessel, said vacuum-processing apparatus further comprising:

a controller for controlling a controlled parameter affecting the effect of the process directly so that the controlled parameter is maintained at a target value; and a processing condition compensator storing a model function determined on the basis of a mode of variation of the effect of the process and a mode of change of the controlled parameter, and calculating the target value of the controlled parameter on the basis of the model function and a set value of a set parameter representing the effect of the process.

9. The vacuum-processing apparatus according to claim 8, wherein the processing condition compensator updates the model function on the basis of measured data of the effect of the process.

10. The vacuum-processing apparatus according to claim 8, wherein the model function is an autoregressive moving-average model represented by Expression (1):

$$r_t = \{B(Z^{-1})/A(Z^{-1})\} \cdot D_t \tag{1}$$

where:

$r_t$ represents the target value of the controlled parameter,
$D_t$ represents the set value of the set parameter,
$A(Z^{-1})$ is equal to $1+a_1+Z^{-1}+a_2 Z^{-2}+ \ldots +a_n Z^{-n}$,
$B(Z^{-1})$ is equal to $b_1 Z^{-1} b_2 Z^{-2}+ \ldots +b_n Z^{-n}$,
wherein the coefficients $a_1$ to $a_n$ are represented by $a_i$, the coefficients $b_1$ to $b_n$ are represented by $b_i$, and $Z^{-1}$ to $Z^{-n}$ are represented by $Z^{-i}$, where i=1 to n, $Z^{-i}$ are time-delay operators, $Z^{-i}$ indicates data obtained in a processing cycle preceding the present processing cycle by "i" processing cycles.

* * * * *